United States Patent
Byun et al.

(10) Patent No.: US 8,493,768 B2
(45) Date of Patent: Jul. 23, 2013

(54) MEMORY CELL AND MEMORY DEVICE USING THE SAME

(75) Inventors: Chunwon Byun, Daejeon (KR); ByeongHoon Kim, Gyeonggi-do (KR); Sung Min Yoon, Daejeon (KR); Shinhyuk Yang, Gyeonggi-do (KR); Min Ki Ryu, Seoul (KR); Chi-Sun Hwang, Daejeon (KR); Sang-Hee Park, Daejeon (KR); Kyoung Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 91 days.

(21) Appl. No.: 13/300,688

(22) Filed: Nov. 21, 2011

(65) Prior Publication Data
US 2012/0134197 A1 May 31, 2012

(30) Foreign Application Priority Data
Nov. 23, 2010 (KR) .................... 10-2010-0116736

(51) Int. Cl.
*G11C 11/22* (2006.01)

(52) U.S. Cl.
USPC ........... 365/145; 365/49.13; 365/65; 365/117

(58) Field of Classification Search
USPC ................. 365/145, 49.13, 65, 117
See application file for complete search history.

(56) References Cited

U.S. PATENT DOCUMENTS

| | | | | |
|---|---|---|---|---|
| 5,029,128 A | * | 7/1991 | Toda | 365/145 |
| 5,412,596 A | * | 5/1995 | Hoshiba | 365/145 |
| 5,822,240 A | * | 10/1998 | Yoo | 365/145 |
| 5,991,188 A | * | 11/1999 | Chung et al. | 365/145 |
| 6,392,920 B2 | * | 5/2002 | Fujimori | 365/145 |
| 6,504,748 B2 | * | 1/2003 | Choi et al. | 365/145 |
| 6,667,501 B2 | * | 12/2003 | Shimada | 257/295 |
| 7,898,009 B2 | * | 3/2011 | Wilson et al. | 257/278 |
| 7,990,749 B2 | * | 8/2011 | Evans, Jr. | 365/145 |
| 8,339,836 B2 | * | 12/2012 | Yamazaki et al. | 365/149 |

FOREIGN PATENT DOCUMENTS

| | | |
|---|---|---|
| KR | 10-2001-0108399 A | 12/2001 |
| KR | 10-2003-0091761 A | 12/2003 |
| KR | 10-2004-0052018 A | 6/2004 |

OTHER PUBLICATIONS

Tsuyoshi Sekitani et al., "Printed Nonvolatile Memory for a Sheet-Type Communication System", IEEE Transactions on Electron Devices, vol. 56, No. 5, pp. 1027-1035, Downloaded on May 2009.
Sung-Min Yoon et al., "Nondestructive Readout Operation of Oxide-Thin-Film-Transistor-Based 2T-Type Nonvolatile Memory Cell", IEEE Electron Device Letters, vol. 31, No. 2, pp. 138-140. Feb. 2010.

* cited by examiner

*Primary Examiner* — Viet Q Nguyen
(74) *Attorney, Agent, or Firm* — Rabin & Berdo, P.C.

(57) ABSTRACT

Provided is a memory cell including: a ferroelectric transistor; a plurality of switching elements electrically connected to the ferroelectric transistor; and a plurality of control lines for transmitting individual control signals to each of the plurality of switching element for separately controlling the plurality of switching elements. The plurality of switching elements are configured to be separately controlled on the basis of the individual control signals so as to prevent each electrode of the ferroelectric transistor from being floated.

18 Claims, 14 Drawing Sheets

MEMORY CELL AND MEMORY DEVICE USING THE SAME

CROSS-REFERENCE TO RELATED APPLICATIONS

This application is based on and claims priority from Korean Patent Application No. 10-2010-0116736, filed on Nov. 23, 2010, with the Korean Intellectual Property Office, the disclosure of which is incorporated herein in its entirety by reference.

TECHNICAL FIELD

The present disclosure relates to a memory cell and a memory device using the same. More particularly, the present disclosure relates to a nonvolatile nondestructive read-out random access memory cell having a ferroelectric transistor, and a memory array device using the same.

BACKGROUND

A ferroelectric material has a spontaneous polarization characteristic, and the direction of spontaneous polarization (remanent polarization) of the ferroelectric material can be controlled by the direction of an electric field. Therefore, the ferroelectric material can be polarized by applying a predetermined voltage (V) or an electric field (V/m) utilizing the polarization characteristic.

FIG. 1 is a graph illustrating a hysteresis characteristic of the ferroelectric material. In FIG. 1, a horizontal coordinate (horizontal axis) represents a potential difference between two electrodes of the ferroelectric material, that is, a voltage between both ends of the ferroelectric material, and a vertical coordinate (vertical axis) represents an amount of charge induced on the surface of the ferroelectric material according to the spontaneous polarization of the ferroelectric material, that is, polarizability ($\mu C/cm^2$).

As shown in FIG. 1, if the voltage applied to the ferroelectric material increases in a forward direction (a→b→c), a polarized state moves to reach a saturation state 'c' in which the polarized state of the ferroelectric material is constantly maintained. As described above, in the case where the voltage (V) applied to the ferroelectric material continuously increases in the forward direction, that is, in the right direction in FIG. 1, even when the magnitude of the applied voltage increases to more than a predetermined value, the polarized state is constantly maintained without increasing the polarizability of the ferroelectric material any further.

If the voltage applied to the ferroelectric material in the saturation state 'c' decreases in the reverse direction, that is, in the left direction in FIG. 1 (c→d), the polarizability decreases gradually. In this case, even when the voltage becomes 0 (a state 'd'), a predetermined value of polarization remains in the ferroelectric material. At this time, the polarization remaining in the ferroelectric material is called a remanent polarization.

Subsequently, if the voltage applied to the ferroelectric material continuously increases in the reverse direction, that is, in the left direction in FIG. 1 (d→e→f), the polarized state moves along the graph of FIG. 1. At this time, similar to when the voltage increases in the forward direction, even when the magnitude of the applied voltage increases to more than a predetermined value, the polarization of the ferroelectric material reaches a saturation state 'f' in which the polarized state is constantly maintained without increasing the polarizability of the ferroelectric material any further.

Then, if the magnitude of the voltage applied to the ferroelectric material decreases in the forward direction, the polarization of the ferroelectric material varies along with a path different from the path during the reverse increase of the magnitude of the voltage. That is, if the magnitude of the voltage decreases in the forward direction from the saturation state 'f', the polarized state of the ferroelectric material varies along the path from 'f' to 'a', not the path from 'f' to 'e'. At this time, if the voltage becomes 0 (a state 'a'), the ferroelectric material has a predetermined value of remanent polarization.

As a result, after the voltage applied to the ferroelectric material increases in the forward direction so as to reach the saturation state 'c', if the applied voltage varies in the reverse direction, the polarized state of the ferroelectric material varies along a path from 'c' to 'f' via 'd' and 'e' (c→d→e→f) as shown in FIG. 1. Meanwhile, after the polarization of the ferroelectric material reaches the saturation state T, if the applied voltage varies in the forward direction, the polarized state of the ferroelectric material varies along a path from 'f' to 'c' via 'a' and 'b' (f→a→b→c) as shown in FIG. 1. As a result, a loop, called a hysteresis loop, is formed as shown in FIG. 1.

It can be seen from the hysteresis loop that the ferroelectric material maintains the predetermined polarized state 'a' or 'd' by the remanent polarization even when the voltage or electric field applied to the ferroelectric material is removed.

A ferroelectric random access memory (FeRAM) device using the ferroelectric material can store data '0' and '1' by corresponding the polarized states 'a' and 'd' in the hysteresis loop, respectively, to the binary data, after the voltage or electric field is removed.

For example, the FeRAM device may make the state 'd' to correspond to binary data '1', and make the state 'a' to correspond to binary data '0' as shown in FIG. 1, thereby storing the binary data. That is, after the electric field applied to the ferroelectric material increases in the forward direction such that the polarized state of the ferroelectric material reaches the saturation state 'c', the electric field may be removed so that the ferroelectric material has a remanent polarization state 'd', whereby data '1' may be stored. Further, after the electric field applied to the ferroelectric material increases in the reverse direction such that the polarized state of the ferroelectric material reaches the saturation state 'f', the electric field may be removed so that the ferroelectric material has a remanent polarization state 'a', whereby data '0' may be stored.

FIG. 2 is a circuit diagram of a memory device according to the related art, which has ferroelectric transistors. As shown in FIG. 2, in the case of a memory device including only a single ferroelectric transistor in each memory cell, it is advantageous in improving the integration degree of memory through a simple configuration and space saving. However, in the memory device shown in FIG. 2, a random access may not be possible, since the ferroelectric transistors are directly connected to each other and thus interference occurs by a neighboring ferroelectric transistor during a read operation.

FIG. 3 is a circuit diagram of a memory device according to the related art which includes ferroelectric transistors and organic transistors. FIG. 3 shows a process of storing data '1' and '0' in a first row of a memory array (step 1) and, then, a process of storing data '0' and '1' in a second row (step 2).

In the memory device shown in FIG. 3, each of the ferroelectric random access memory cells includes a ferroelectric transistor and an organic transistor. Specifically, a single memory cell includes an access transistor, a ferroelectric transistor, and an erase transistor. And three word lines WLA, WLM, and WLE, bit lines BL, and a ground line are provided to control each of the transistors.

According to the configuration of the memory device shown in FIG. 3, a random access operation may be possible during a read operation, since the ferroelectric transistors can be operated separately in each row by using the access transistors and the erase transistors.

However, the memory device shown in FIG. 3 has a problem in that a write operation is unstable. In general, when a gate-drain voltage ($V_{GD}$) of the ferroelectric transistor is equal to a gate-source voltage ($V_{GS}$) of the ferroelectric transistor, the electric field applied between both electrodes of the ferroelectric material can become uniform so as to induce a smooth polarization. However, according to the configuration of the memory device of FIG. 3, the source of each ferroelectric transistor is grounded so as to fix the voltage of the source terminal, and the voltage of a corresponding bit line BL is changed so as to change the voltage of the drain terminal to program the data. Accordingly, during the data programming, the gate-drain voltage is not equal to the gate-source voltage. Therefore, the memory device of FIG. 3 has problems in that accurate data may not be written during the data programming. Also, in order to induce a smooth polarization of the ferroelectric material, a considerable voltage should be applied.

FIG. 4 is a circuit diagram of a memory device according to the related art, which includes one ferroelectric transistor and two pass transistors in each memory cell.

In the memory device shown in FIG. 4, each memory cell includes one ferroelectric transistor FT11 and two pass transistors TA11 and TB11. Here, pass transistor TB11 connected to the gate terminal of ferroelectric transistor FT11 serves as a switch for passing or interrupting a program signal, and pass transistor TA11 connected to the source (or drain) terminal of the ferroelectric transistor functions to control the output of the corresponding memory cell. According to the configuration of the memory device of FIG. 4, when a write or read operation is performed on any one memory cell, since other neighboring memory cells are not influenced, random access is possible. However, in the configuration of FIG. 4, when a scan signal $V_{SCAN}$ connected to the gates of two pass transistors TA11 and TB11 does not exist, that is, in the case where both of two pass transistors are turned off, a floating electrode occurs between the ferroelectric transistor and each of the pass transistors. The voltage of the floating electrode cannot be accurately controlled, and thus an undesired electric field may be applied to the ferroelectric material of the ferroelectric transistor. As a result, the memory may have a serious problem as a storage device in which information is rewritten or erroneously written to the ferroelectric transistor. A specific operation of the memory device shown in FIG. 4 will be described below in more detail.

As described above, the memory devices in the related art have various problems. For example, in the memory device of FIG. 2, random access is impossible, and in the memory device of FIG. 3, accurate data writing is not achieved during programming. Further, the memory device of FIG. 4 has a problem in which the floating electrode of the ferroelectric transistor occurs.

SUMMARY

The present disclosure has been made in an effort to provide a memory cell and a memory array device using the same.

An exemplary embodiment of the present disclosure provides a memory cell including: a ferroelectric transistor; a plurality of switching elements electrically connected to the ferroelectric transistor; and a plurality of control lines for transmitting individual control signals to each of the plurality of switching elements for controlling the plurality of switching elements. Here, the plurality of switching elements may be configured to be separately controlled on the basis of the individual control signals so as to prevent each electrode of the ferroelectric transistor from being floated Another exemplary embodiment of the present disclosure provides a memory device including a plurality of memory cells arranged in a plurality of rows and a plurality of columns. Here, each of the memory cells may include a ferroelectric transistor, a plurality of switching elements electrically connected to the ferroelectric transistor, and a plurality of control lines for transmitting individual control signals to each of the plurality of switching elements for controlling the plurality of switching elements. Further, the plurality of switching elements may be configured to be separately controlled on the basis of the individual control signals so as to prevent each electrode of the ferroelectric transistor from being floated, and the plurality of switching elements arranged in each row may be controlled by the plurality of control lines corresponding to each row.

The memory device according to the exemplary embodiments of the present disclosure has various advantageous. For example, a random access is possible, a read operation can be performed in a nondestructive manner when a read function is performed, data can be accurately written when a write function is performed, and electrodes can be prevented from being floated in the entire memory array during all the operations. Therefore, the overall stability of the memory system may be improved substantially.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

As described above, in a memory using ferroelectric transistors, desired data can be stored by controlling a polarized state of a ferroelectric material. In order to minimize errors during data write and read operations, the polarized state of the ferroelectric material needs to be controlled accurately. If an operation to write data '1' or '0' is tried, but the polarized state of the ferroelectric material responding to the operation is ambiguous, determination of the data value intended as '1' or '0' may not be clear during a read operation such that an error may occur during the read operation.

Figure 5:
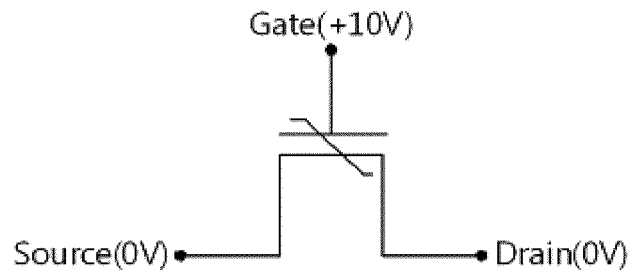
FIG. 5 shows a condition for writing '1' in a ferroelectric transistor.

FIG. 5 shows a condition for writing '1' in a ferroelectric transistor. As shown in FIG. 5, in order to write digital data '1' in the ferroelectric transistor, gate-drain voltage $V_{GD}$ and gate-source voltage $V_{GS}$ should be a positive voltage having the same appropriate magnitude, for example, 10 V, and the source-drain voltage $V_{SD}$ should be 0V.

Figure 6A:
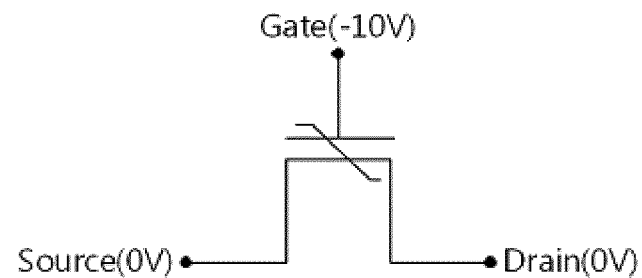
FIGS. 6A and 6B show conditions for writing '0' in the ferroelectric transistor.
Figure 6B:
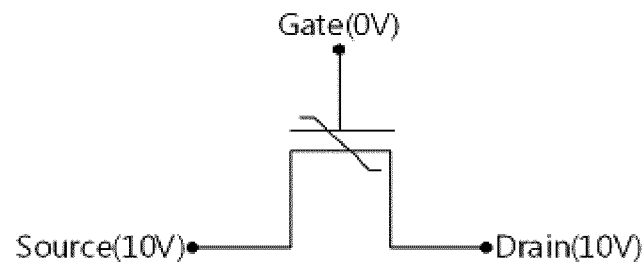

FIGS. 6A and 6B show conditions for writing '0' in the ferroelectric transistor. As shown in FIG. 6A, in order to write digital data '0' in the ferroelectric transistor, the source voltage and the drain voltage are set to 0 V and the gate voltage is set to a negative voltage having an appropriate magnitude, for example, −10 V such that gate-drain voltage $V_{GD}$ and gate-source voltage $V_{GS}$ are a negative voltage having the same appropriate magnitude and the source-drain voltage $V_{SD}$ is 0V. Alternatively, as shown in FIG. 6B, a positive voltage having the same appropriate magnitude, for example, 10 V may be applied to the source, and the drain and the gate voltage may be set to 0 V such that gate-drain voltage $V_{GD}$ and gate-source voltage $V_{GS}$ are the negative voltage having the same appropriate magnitude and the source-drain voltage $V_{SD}$ is 0V, similar to the case shown in FIG. 6A.

As shown in FIGS. 5, 6A, and 6B, if the conditions of $V_{GD}=V_{GS}$ and $V_{SD}=0$ are satisfied during the data write operation such that an electric field is most uniformly applied to the ferroelectric material of the ferroelectric transistor, it is possible to induce a smooth polarization of the ferroelectric material and to achieve an accurate write operation through the smooth polarization.

Figure 7:
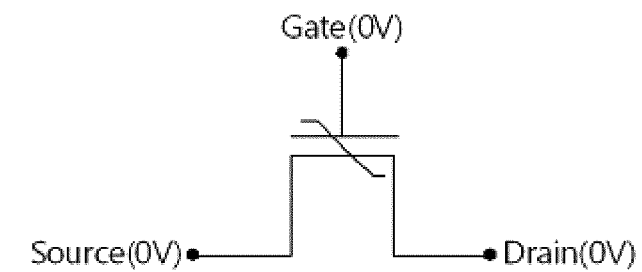
FIG. 7 shows a condition for maintaining previous data in the ferroelectric transistor.

FIG. 7 shows a condition for maintaining previous data in the ferroelectric transistor. As shown in FIG. 7, if voltages are applied such that the condition of $V_{GS}=V_{GD}=V_{SD}=0$ is satisfied, an electric field is not formed in the ferroelectric transistor, and thus, the ferroelectric transistor can maintain previously stored data.

In order to make a random access possible and perform write and read operations without errors by using the ferroelectric transistor as in the above-mentioned method, each memory cell of a memory array should not be influenced by neighboring memory cells and each memory cell should be independently driven.

Figure 1:
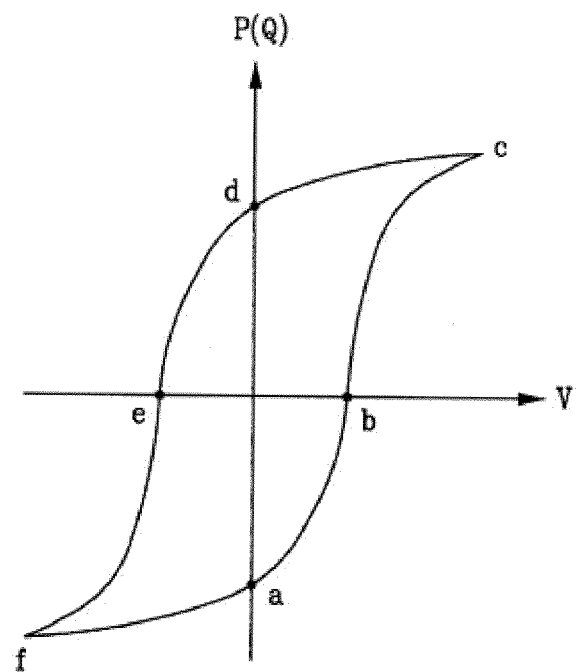
FIG. 1 is a graph illustrating a hysteresis loop representing the characteristic of a general ferroelectric material.
Figure 2:
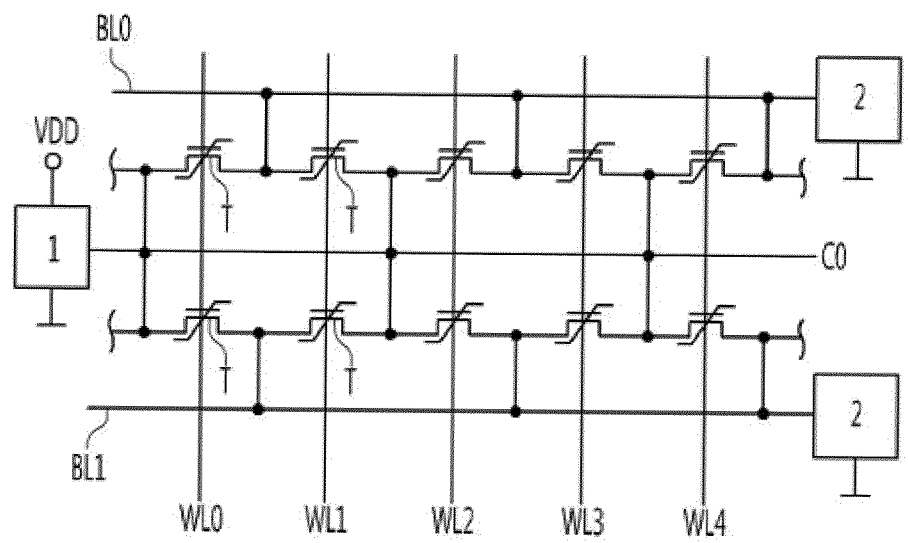
FIG. 2 is a circuit diagram of a memory device according to the related art using a ferroelectric transistor.
Figure 3:
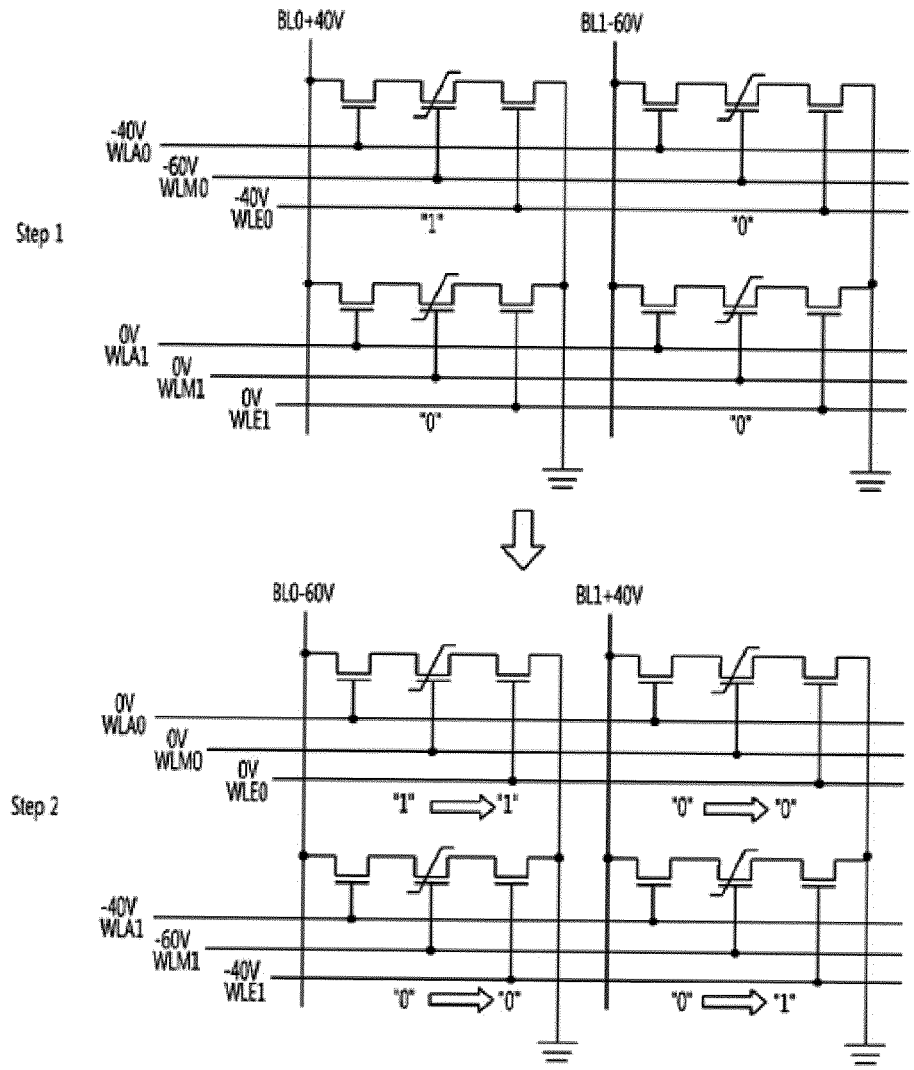
FIG. 3 is a circuit diagram of a memory device according to the related art having ferroelectric transistors and organic transistors.
Figure 4:
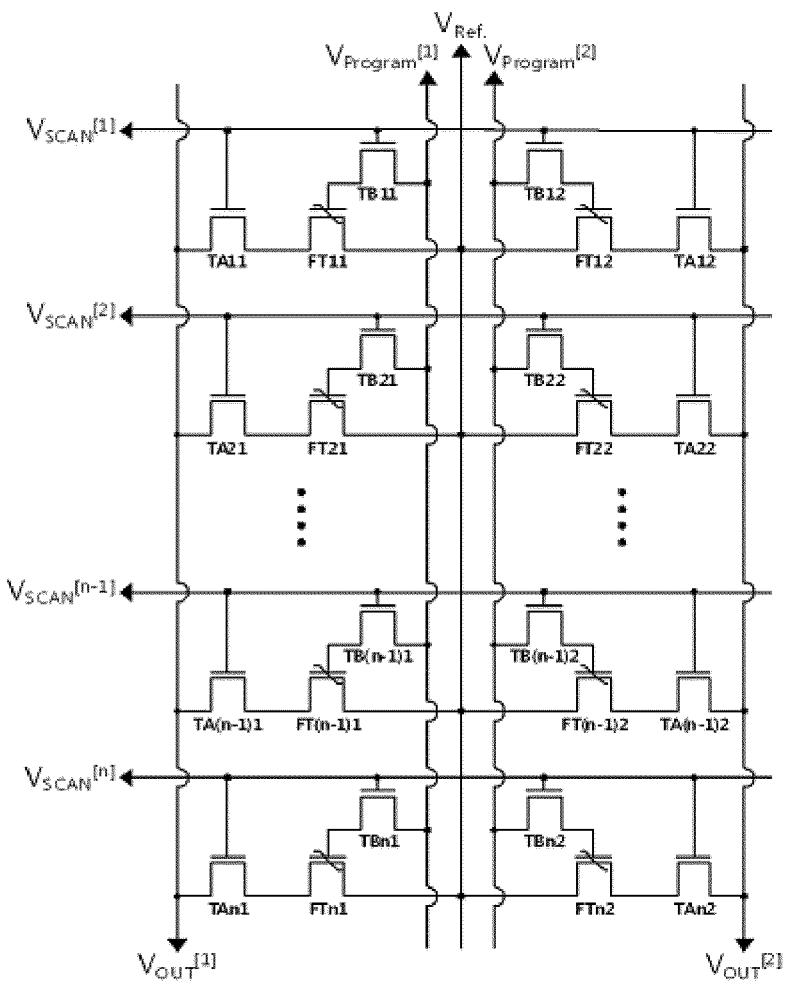
FIG. 4 is a circuit diagram of a memory device according to the related art which uses one ferroelectric transistor and two pass transistors in each memory cell.
Figure 8:
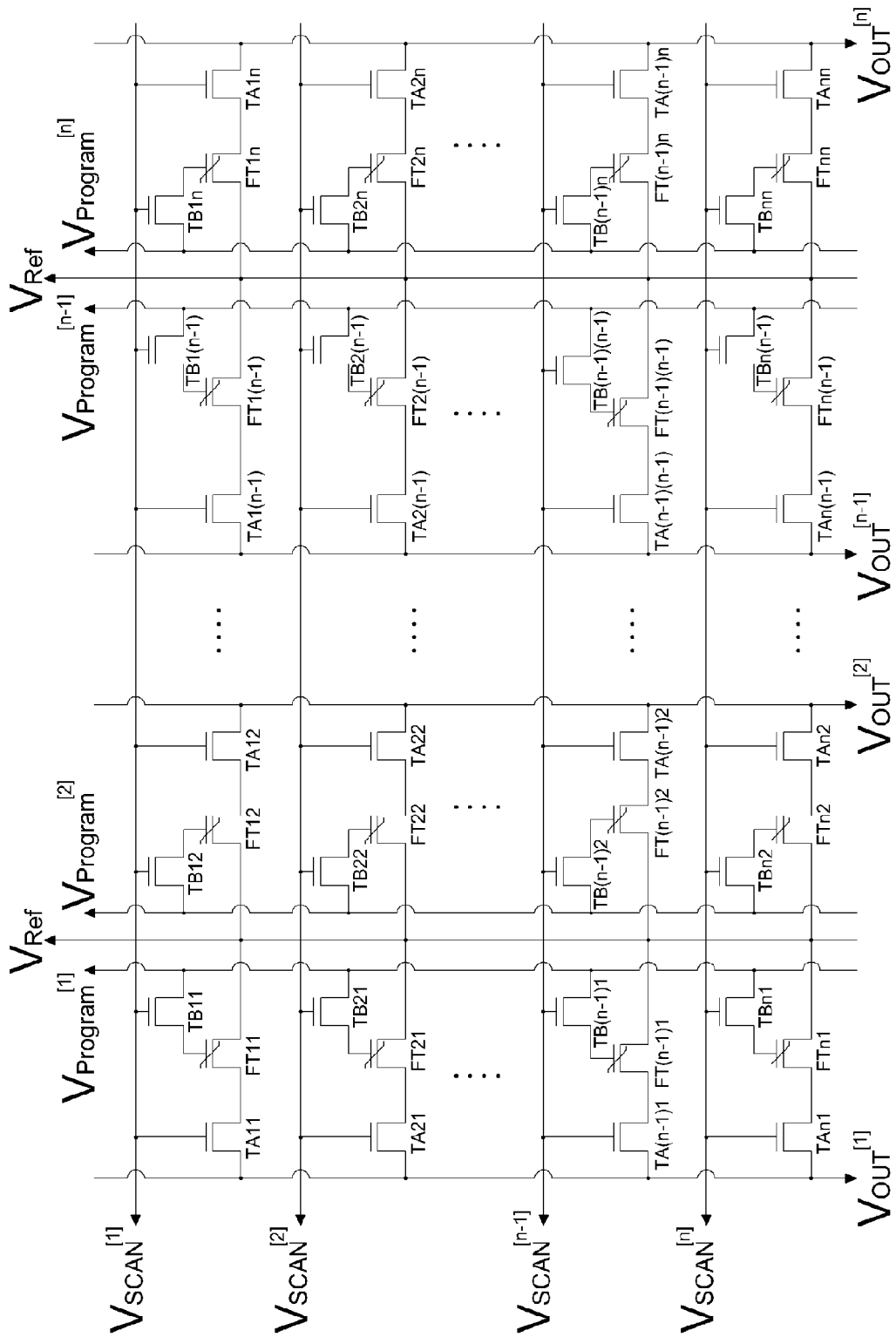
FIG. 8 shows a memory array configuration using the memory device of FIG. 4.

FIG. 8 shows a memory array configuration using the memory device of FIG. 4 described as the related art. According to the memory array configuration of FIG. 8, each memory cell unit can be independently driven. Therefore, a random access is possible and write and read operations can be performed on each memory cell unit.

Figure 9:
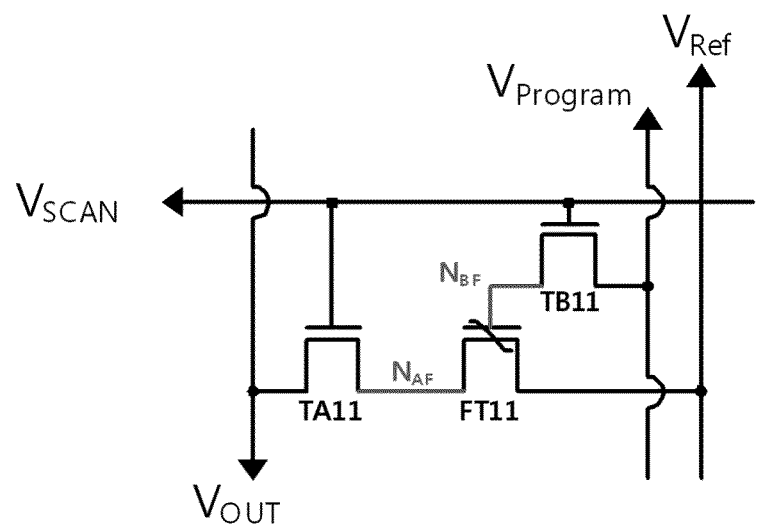
FIG. 9 is an enlarged diagram of one memory cell of the memory array configuration of FIG. 8.

FIG. 9 is an enlarged diagram of one memory cell of the memory array configuration of FIG. 8. In FIG. 9, when both of a ferroelectric transistor FT11 and a first pass transistor TA11 connected to a source electrode of ferroelectric transistor FT11 are turned off, an $N_{AF}$ electrode connecting the source electrode of ferroelectric transistor FT11 and first pass transistor TA11 is floated. Further, when a second pass transistor TB11 connected to a gate electrode of ferroelectric transistor FT11 is turned off, an $N_{BF}$ electrode connecting the gate electrode of ferroelectric transistor FT11 and second pass transistor TB11 is floated. Therefore, as described in the related art with reference to FIG. 4, in the memory configurations shown in FIGS. 4 and 8, the floating electrode between the ferroelectric transistor and each of the pass transistors occurs. For this reason, the voltage of the floating electrode cannot be accurately controlled. Therefore, an undesired signal may be applied to ferroelectric transistor FT11. In order to prevent an undesired signal from being applied to ferroelectric transistor FT11, the gate electrode of each of the pass transistors should be separately controlled to remove the floating electrodes of the ferroelectric transistor.

Figure 10:
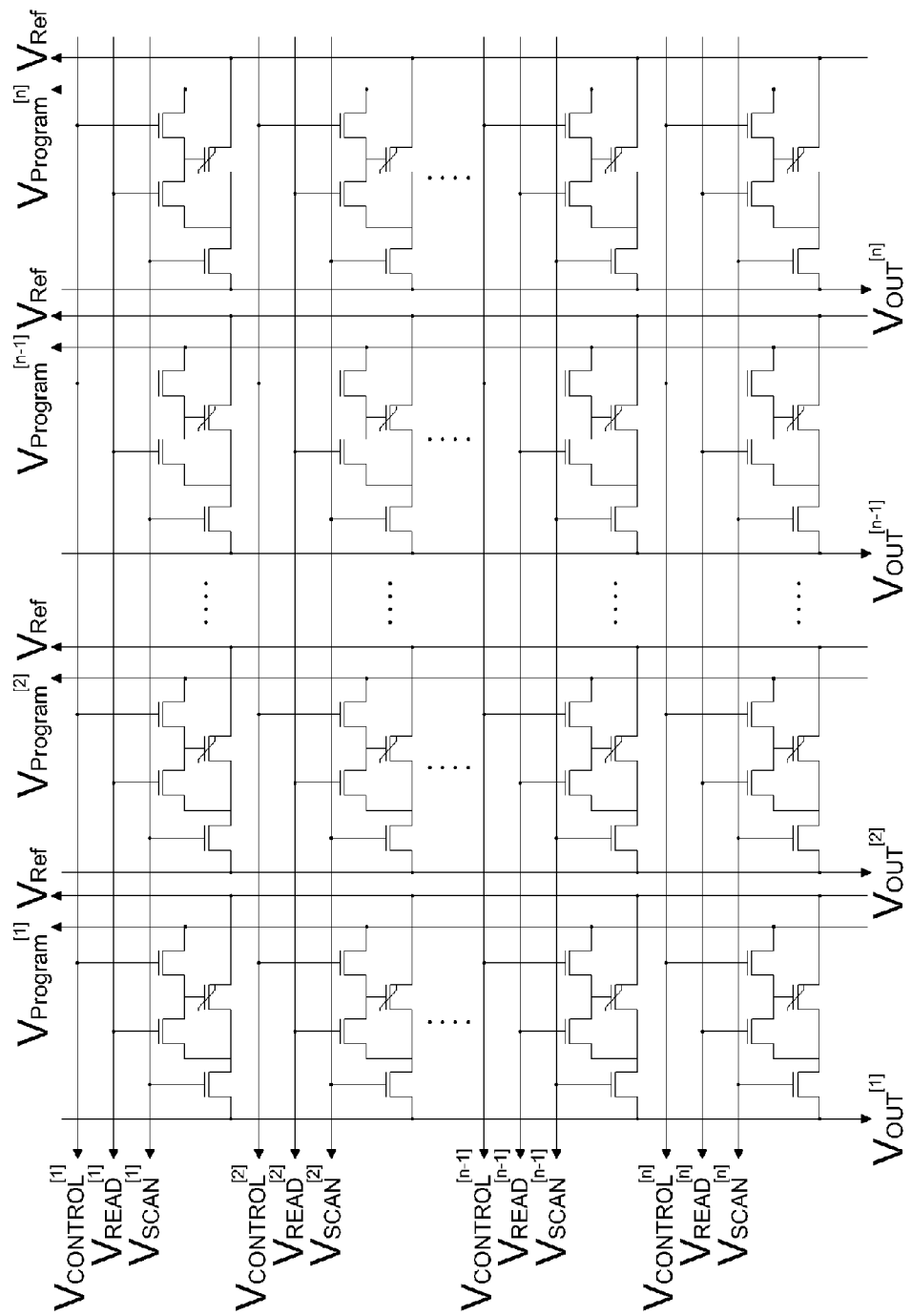
FIG. 10 shows a memory array configuration according to an exemplary embodiment of the present disclosure.

FIG. 10 shows a memory array configuration according to an exemplary embodiment of the present disclosure. The memory array configuration of FIG. 10 includes n×n memory cells arranged in n-number of rows and n-number of columns. Each of the memory cells includes one ferroelectric transistor and three pass transistors electrically connected to at least one electrode of the ferroelectric transistor. Each of the pass transistors is separately controlled by an individual control line. Further, pass transistors arranged in each row are controlled by control lines corresponding to the row. Therefore, pass transistors arranged in different rows are separately controlled by different control lines. As a result, the pass transistors can be independently controlled for each row.

As shown in FIG. 10, control lines $V_{CONTROL}$, read lines $V_{READ}$, and scan lines $V_{SCAN}$ extend in a horizontal direction along the individual rows of the n×n memory array. For example, in FIG. 10, a reference symbol $V_{CONTROL}{}^{[1]}$ denotes a control line $V_{CONTROL}$ which extends in the horizontal direction in the first row of the n×n memory array and is connected to memory cells arranged in the first row. Control lines $V_{CONTROL}$, read lines $V_{READ}$, and scan lines $V_{SCAN}$ operate as control lines for the individual rows of the memory array, and a specific operation of the lines will be described below.

As shown in FIG. 10, out lines $V_{OUT}$, program lines $V_{Program}$, and reference lines $V_{Ref}$ extend in a vertical direction along the individual columns of the n×n memory array. For example, in FIG. 10, a reference symbol $V_{OUT}{}^{[1]}$ denotes an out line $V_{OUT}$ which extends in the vertical direction in the first column of the n×n memory array and is connected to memory cells arranged in the first column. Out lines $V_{OUT}$, program lines $V_{Program}$, and reference lines $V_{Ref}$ operate as input/output lines for the individual columns of the memory array, and a specific operation of the lines will be described below.

Figure 11:
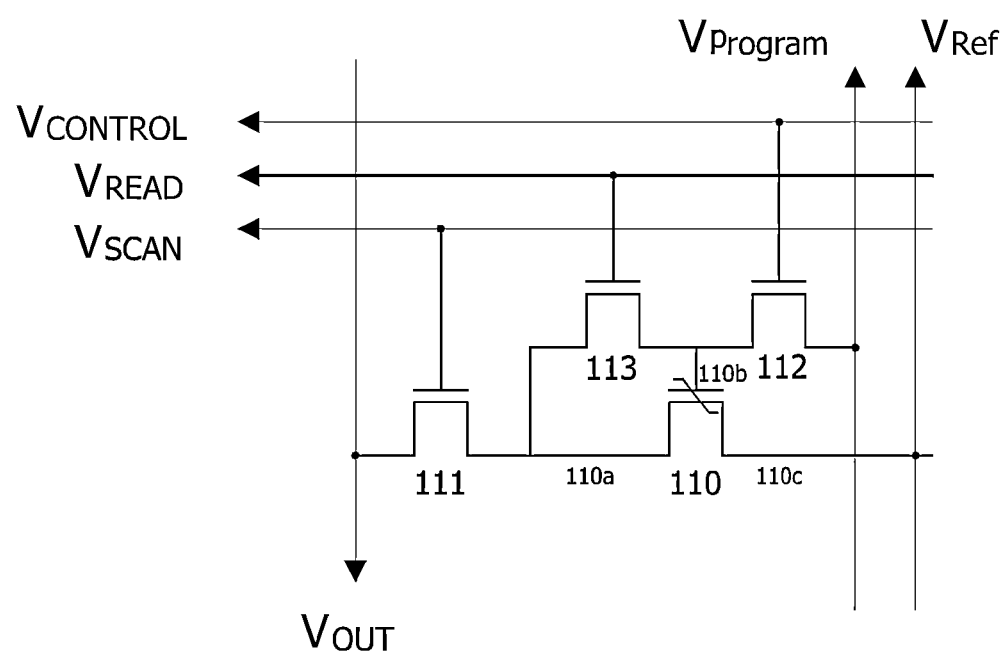
FIG. 11 is an enlarged diagram of one memory cell of the memory array of FIG. 10.

FIG. 11 is an enlarged diagram of one memory cell of the memory array configuration of FIG. 10. As described in FIG.

11, one memory cell includes one ferroelectric transistor 110 and three pass transistors 111, 112, and 113. Each of pass transistors 111, 112, and 113 is connected to at least one electrode of ferroelectric transistor 110 and operates as a switching element for switching connection with a corresponding electrode of ferroelectric transistor 110, for example, a source electrode 110a, a gate electrode 110b, or a drain electrode 110c of ferroelectric transistor 110.

Specifically, first pass transistor 111 functions to connect source electrode 110a of ferroelectric transistor 110 with an out line $V_{OUT}$, or disconnect source electrode 110a of ferroelectric transistor 110 from the out line $V_{OUT}$. Further, second pass transistor 112 functions to connect the gate electrode 110b of ferroelectric transistor 110 with a program line $V_{Program}$, or disconnect the gate electrode 110b of ferroelectric transistor 110 from program line $V_{Program}$. Furthermore, third pass transistor 113 functions to connect the gate electrode 110b of ferroelectric transistor 110 with source electrode 110a of ferroelectric transistor 110, or disconnect the gate electrode 110b of ferroelectric transistor 110 from source electrode 110a of ferroelectric transistor 110.

As described above, each of pass transistors 111, 112, and 113 operates as a switching element for switching the connection with at least one electrode of ferroelectric transistor 110. As shown in FIG. 11, the gate electrodes of individual pass transistors 111, 112, and 113 are connected to corresponding control lines, that is, a scan line $V_{SCAN}$, a control line $V_{CONTROL}$, and a read line $V_{READ}$, respectively. Therefore, the gate voltages of individual pass transistors 111, 112, and 113 are separately controlled by scan line $V_{SCAN}$, control line $V_{CONTROL}$, and read line $V_{READ}$, thereby controlling turning on or off each of pass transistors 111, 112, and 113. In this way, each of pass transistors 111, 112, and 113 can be turned on or off by the corresponding control line, whereby individual pass transistors 111, 112, and 113 can operate as independent switching elements.

Figure 12:
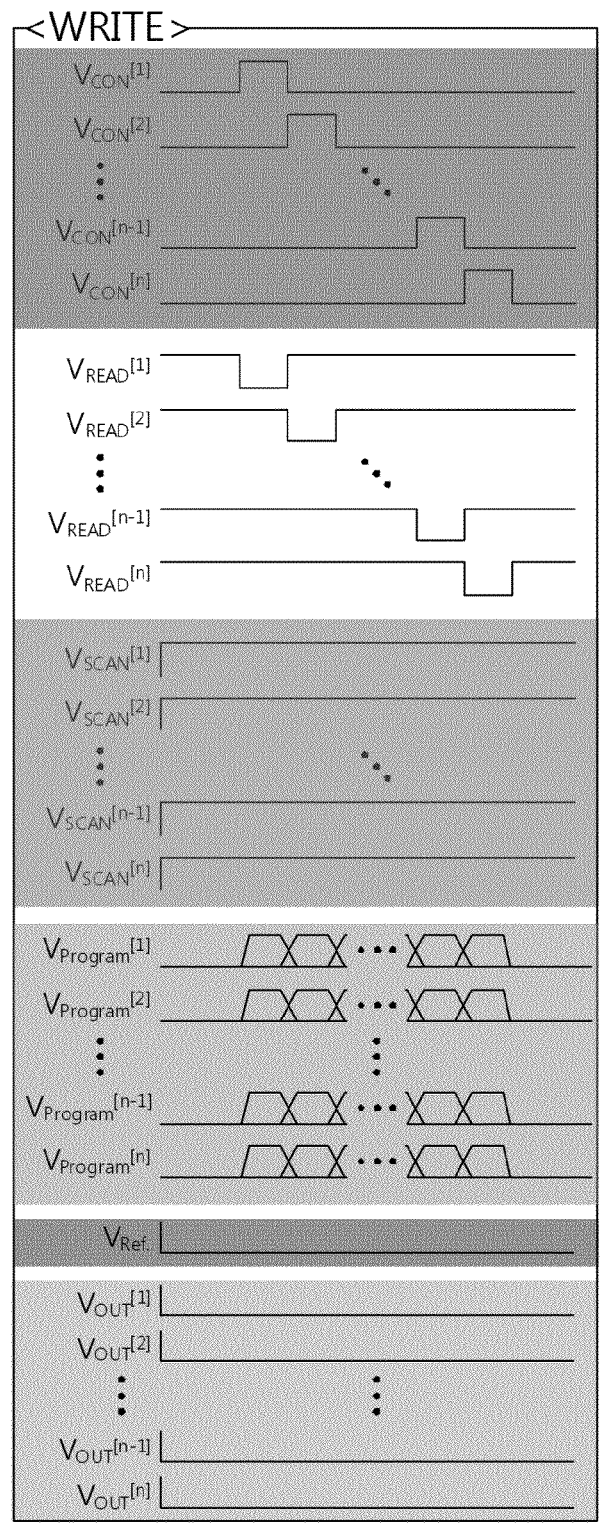
FIG. 12 is a timing diagram of input signals for individual lines in a write operation, according to an exemplary embodiment of the present disclosure.

FIG. 12 is a timing diagram of input signals for individual lines in a write operation, according to an exemplary embodiment of the present disclosure. FIG. 12 shows pulse-type input timing signals applied to three control lines (i.e., a control line $V_{CONTROL}$, a read line $V_{READ}$, and a scan line $V_{SCAN}$), and three input/output lines (i.e., a program line $V_{Program}$, a reference line $V_{Ref}$, and an out line $V_{OUT}$). Reference symbols of individual input timing signals lines shown in FIG. 12 correspond to individual lines in the memory array configuration including the n×n memory cells shown in FIG. 10.

Referring to FIG. 12, individual signals of the first row to the n-th row are input to control lines $V_{CONTROL}$, read lines $V_{READ}$, and scan lines $V_{SCAN}$, and individual signals of the first column to the n-th column are input to program lines $V_{Program}$ and out lines $V_{OUT}$. For example, an input timing signal $V_{CON}^{[1]}$ of FIG. 12 represents an input timing signal of control line $V_{CONTROL}$ connected to the n-number of memory cells arranged in the first row in the memory array configuration shown in FIG. 10, and an input timing signal $V_{Program}^{[1]}$ of FIG. 12 represents an input timing signal of program line $V_{Program}$ connected to the n-number of memory cells arranged in the first column in the memory array configuration shown in FIG. 10. Meanwhile, a single signal having a low value is input to reference lines $V_{Ref}$ for supplying a reference signal. Hereinafter, in order to understand a write operation of FIG. 12, a specific write operation on one memory cell will be described with reference to FIGS. 13A, 13B, 13C, and 13D.

Figure 13A:
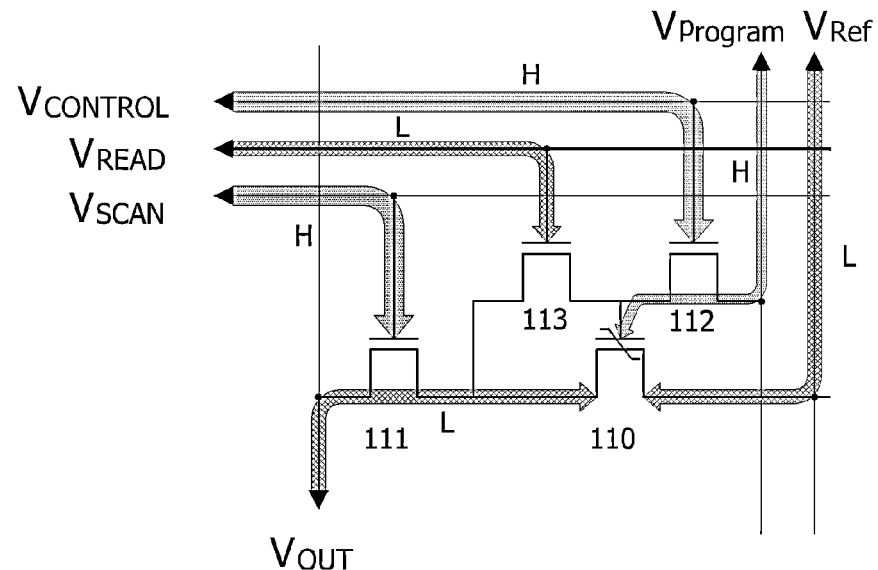
FIGS. 13A, 13B, 13C, and 13D show a write operation on one memory cell according to the timing diagram of FIG. 12.

FIG. 13A shows an operation for writing data '1' in a memory cell, according to the timing diagram of FIG. 12. In the drawing, a high signal transmitted to each line is denoted by 'H', and a low signal is denoted by 'L'. As shown in FIG. 13A, if a high signal H is applied to scan line $V_{SCAN}$, a high signal H is applied to control line $V_{CONTROL}$, and a low signal L is applied to read line $V_{READ}$, first pass transistor 111 and second pass transistor 112 are turned on and third pass transistor 113 is turned off. At this time, in order to write the desired data '1' in ferroelectric transistor 110, appropriate voltages should be applied to out line $V_{OUT}$, program line $V_{Program}$, and reference line $V_{Ref}$. In order to write the desired data '1' in ferroelectric transistor 110, like the condition for writing '1' in the ferroelectric transistor shown in FIG. 5, the same low voltage L is applied to out lines $V_{OUT}$ and reference lines $V_{Ref}$ and a high voltage H corresponding to the data '1' is applied to program lines $V_{Program}$. Therefore, gate-source voltage $V_{GS}$ and gate-drain voltage $V_{GD}$ of ferroelectric transistor 110 become the same positive voltage, whereby the value of '1' is accurately programmed as described above.

Figure 13B:
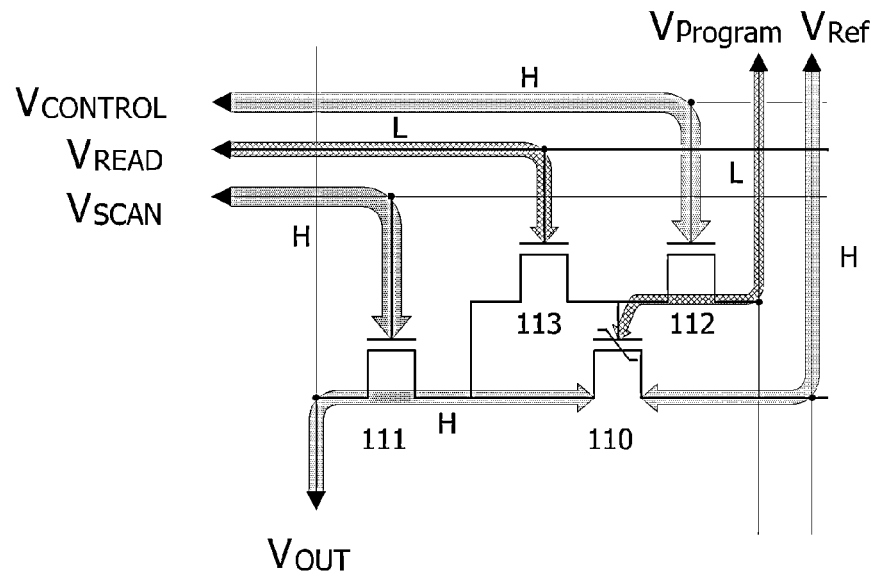

FIG. 13B shows an operation for writing data '0' in a memory cell, according to the timing diagram of FIG. 12. Even in the case of writing data '0', similar to FIG. 13A, a high signal H is applied to scan line $V_{SCAN}$, a high signal H is applied to control line $V_{CONTROL}$, and a low signal L is applied to read line $V_{READ}$, such that first pass transistor 111 and second pass transistor 112 are turned on and third pass transistor 113 is turned off. Meanwhile, in order to write data '0' in ferroelectric transistor 110, like the condition for writing '0' in the ferroelectric transistor shown in FIG. 6B, the same high voltage H is applied to out line $V_{OUT}$ and reference line $V_{Ref}$, and a low voltage L corresponding to the data '0' is applied to program line $V_{Program}$. Here, high voltage H and low voltage L are values relative to each other. Therefore, like the condition for writing '0' in the ferroelectric transistor shown in FIG. 6A, the same voltage of 0 V may be applied to out lines $V_{OUT}$ and reference lines $V_{Ref}$, and an appropriate negative voltage corresponding to the data '0' may be applied to program lines $V_{Program}$. Since the same low voltage L is applied to out line $V_{OUT}$ and reference line $V_{Ref}$ in the timing diagram of FIG. 12, it is possible to write the data '0' by applying the appropriate negative voltage to program line $V_{Program}$. In this case, gate-source voltage $V_{GS}$ and gate-drain voltage $V_{GD}$ of ferroelectric transistor 110 become the same negative voltage, whereby the value of '0' is accurately programmed as described above.

Figure 13C:
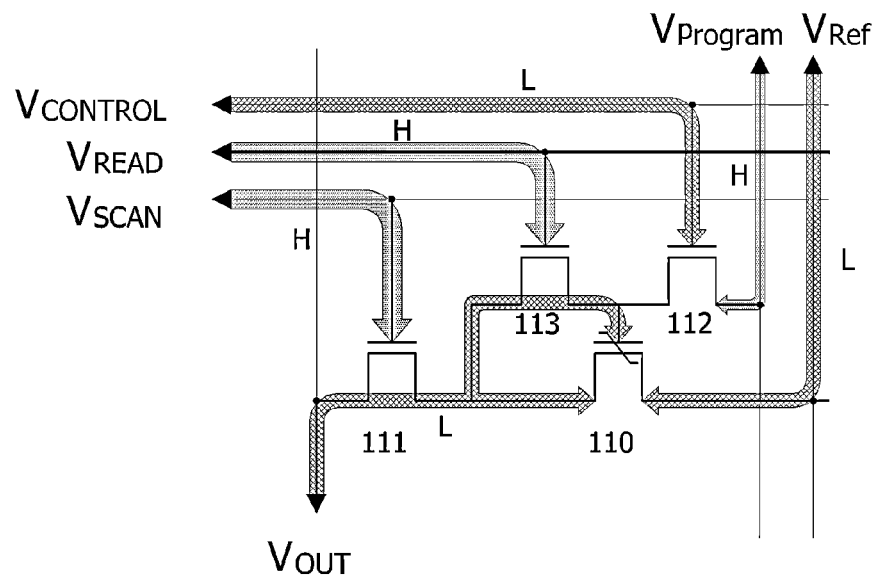
Figure 13D:
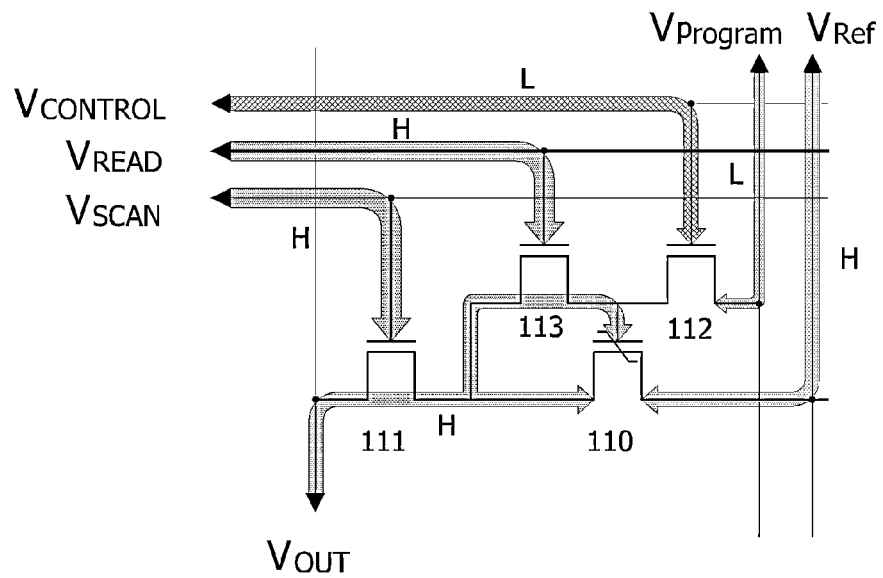

FIGS. 13C and 13D show a standby operation in which a data write operation on the memory cell according to the timing diagram of FIG. 12 is not performed. In the case of the standby operation of FIGS. 13C and 13D, all of the gate, source, and drain of ferroelectric transistor 110 are set to the same voltage such that an electric field applied to ferroelectric transistor 110 is 0, thereby maintaining previously programmed data.

Specifically, FIG. 13C shows the standby operation after data '1' is programmed as in FIG. 13A. A high signal H is applied to scan line $V_{SCAN}$, a low signal L is applied to control line $V_{CONTROL}$, and a high signal H is applied to read line $V_{READ}$, such that first pass transistor 111 and third pass transistor 113 are turned on and second pass transistor 112 is turned off. Further, since third pass transistor 113 is in an ON state, a gate electrode and a source electrode of ferroelectric transistor 110 are connected to each other, and the same low voltage is applied to the gate electrode and the source electrode of ferroelectric transistor 110 by the low voltage applied through out line $V_{OUT}$. Furthermore, since the low voltage is maintained in reference line $V_{Ref}$, all of the gate, source, and drain electrodes of ferroelectric transistor 110 are set to the same low voltage, thereby capable of maintaining the programmed data '1'.

Similar to this, FIG. 13D shows the standby operation after data '0' is programmed as in FIG. 13B. Like the case of the standby operation of FIG. 13C, a high signal H is applied to scan line $V_{SCAN}$, a low signal L is applied to control line $V_{CONTROL}$, and a high signal is applied to read line $V_{READ}$, such that first pass transistor 111 and third pass transistor 113 are turned on and second pass transistor 112 is turned off. Further, since third pass transistor 113 is in an ON state, a gate electrode and a source electrode of ferroelectric transistor 110 are connected to each other, and the same high voltage is applied to the gate electrode and the source electrode of ferroelectric transistor 110 by the high voltage applied through out line $V_{OUT}$. Furthermore, since the high voltage is maintained in reference line $V_{Ref}$, all of the gate, source, and drain electrodes of ferroelectric transistor 110 are set to the same high voltage, thereby maintaining the programmed data '0'.

As described with reference to FIGS. 13A, 13B, 13C, and 13D, according to the exemplary embodiment of the present disclosure, since individual pass transistors 111, 112, and 113 are separately controlled to be turned on or off by control lines $V_{CONTROL}$, read lines $V_{READ}$, and scan lines $V_{SCAN}$, in all sections of the data write operation and the standby operation, a floating electrode does not occur in ferroelectric transistor 110.

Referring back to the memory array configuration of FIG. 10, the n×n memory cells arranged in n-number of rows and n-number of columns exist. Here, for each row, the control lines, that is, control lines $V_{CONTROL}$, read lines $V_{READ}$, and scan lines $V_{SCAN}$ for controlling the memory cells arranged in the corresponding row exist. Therefore, pass transistors arranged in different rows can be separately controlled by different control lines, and thus, a write operation on each row can be independently controlled.

As shown in the timing diagram of FIG. 12, when a high signal H is applied to scan line $V_{SCAN}$, a high signal H is applied to control line $V_{CONTROL}$, and a low signal L is applied to read line $V_{READ}$ for one row subject to a write operation, a high signal H is applied to scan lines $V_{SCAN}$, a low signal L is applied to control lines $V_{CONTROL}$, and a high signal H is applied to read lines $V_{READ}$ for the other rows in a standby operation state. Therefore, signals of program lines $V_{Program}$ can be applied to only one row. Then, when a high signal H is applied to scan line $V_{SCAN}$, a high signal H is applied to control line $V_{CONTROL}$, and a low signal L is applied to read line $V_{READ}$ for the next row, a high signal H is applied to scan lines $V_{SCAN}$, a low signal L is applied to control lines $V_{CONTROL}$, and a high signal H is applied to read lines $V_{READ}$ for the other rows including the previous row having been subject to the write operation, whereby the other rows are maintained in the standby operation state. In this way, after the write operation is performed on each of the rows, the write operation on all rows is completed. Then, it is possible to separately write desired information in a desired memory cell out of the entire memory cell array.

Figure 14:
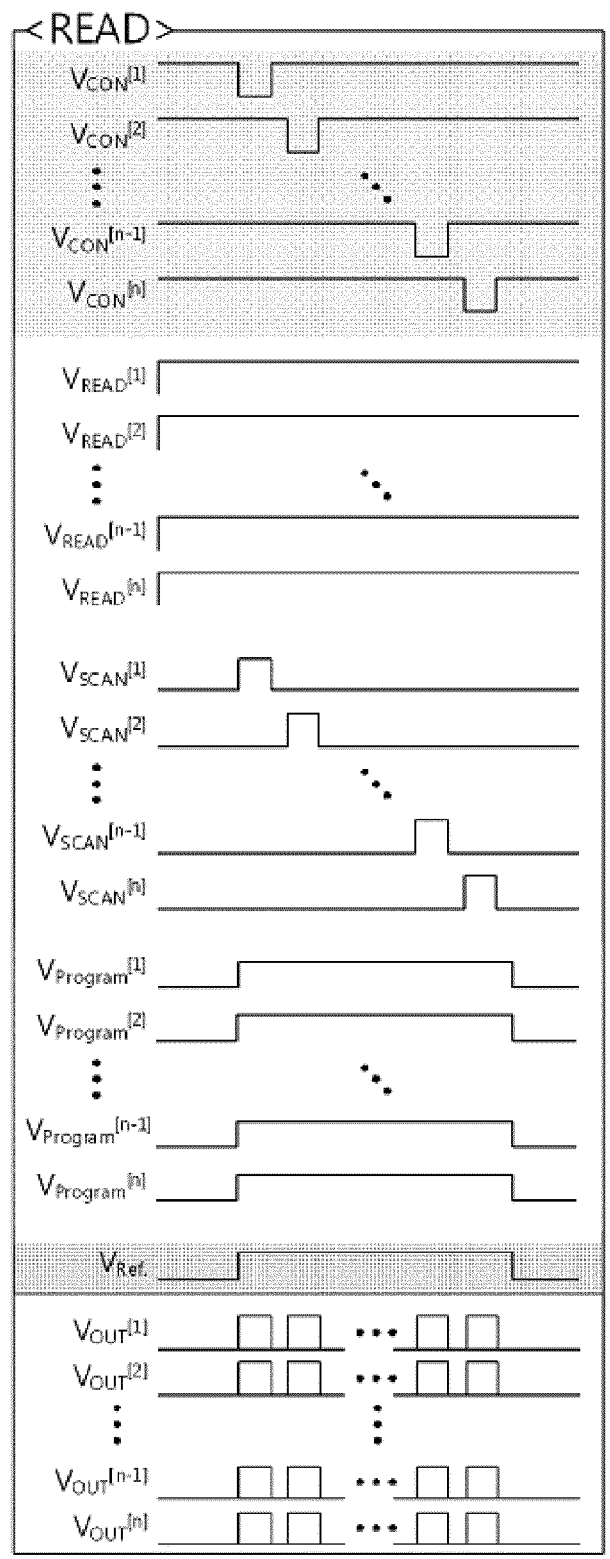
FIG. 14 is a timing diagram of input signals for individual lines in a read operation, according to an exemplary embodiment of the present disclosure.

FIG. 14 is a timing diagram of input signals for individual lines in a read operation, according to an exemplary embodiment of the present disclosure. Similar to the timing diagram of the write operation shown in FIG. 12, individual signals are input to control lines $V_{CONTROL}$, read lines $V_{READ}$, and scan lines $V_{SCAN}$ from the first to n-th rows, thereby performing a read operation for each of the rows. Hereinafter, in order to understand the read operation of FIG. 14, a specific read operation on one memory cell will be described with reference to FIGS. 15A, 15B, and 15C.

Figure 15A:
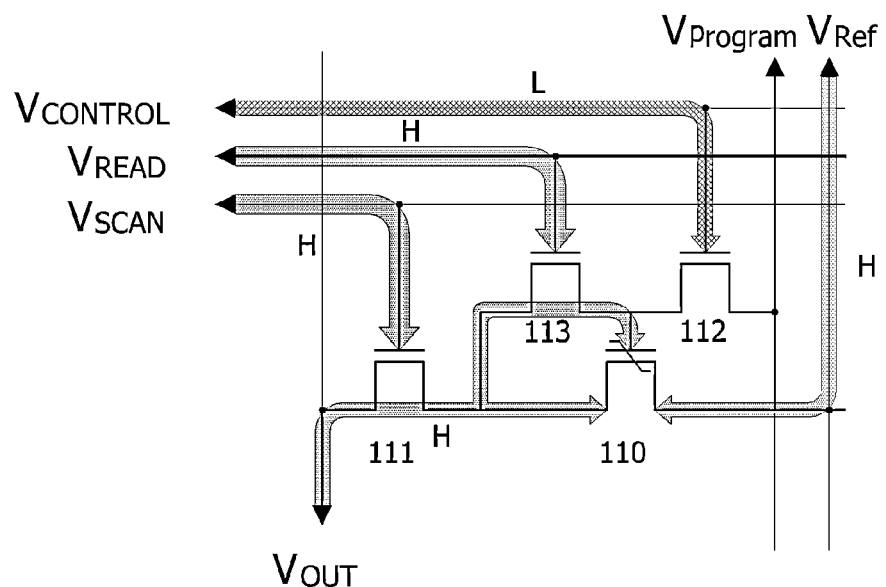
FIGS. 15A, 15B, and 15C show a read operation on one memory cell, according to the timing diagram of FIG. 14.
Figure 15B:
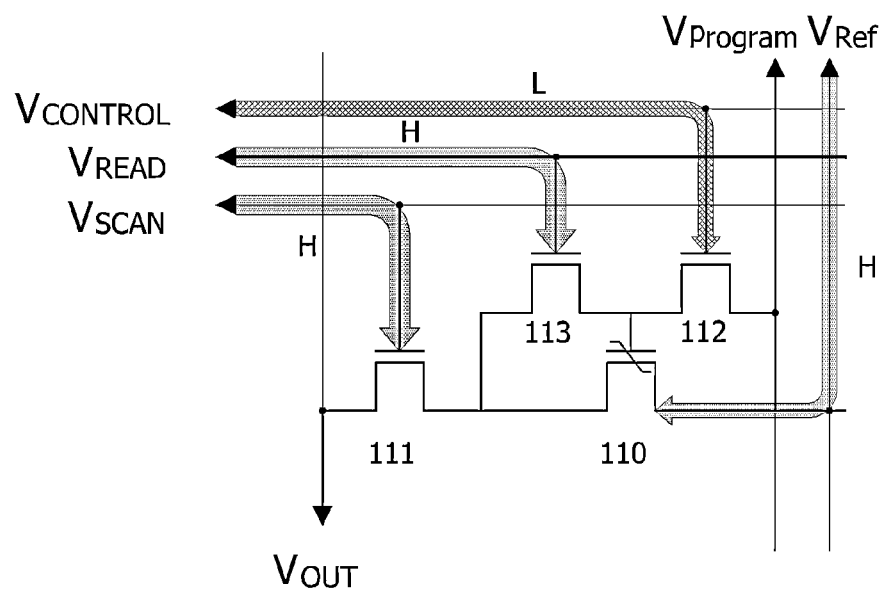

FIGS. 15A and 15B each shows the read operation for reading data '1' and data '0', respectively, written in a memory cell according to the timing diagram of FIG. 14. As shown in FIGS. 15A and 15B, a high voltage is applied to reference line $V_{Ref}$, a high signal H is applied to scan line $V_{SCAN}$, a low signal L is applied to control line $V_{CONTROL}$, and a high signal H is applied to read line $V_{READ}$, such that first pass transistor 111 and third pass transistor 113 are turned on and second pass transistor 112 is turned off. At this time, in the case where the polarized state of ferroelectric transistor 110 is a state of data '1', a large amount of current flows through out line $V_{OUT}$ by an electric field formed in the ferroelectric transistor. Therefore, the current flow accumulates charge in a capacitive element connected to the out line $V_{OUT}$ side, which generates a voltage having a predetermined magnitude. This voltage can be measured to determine the data '1' written in the memory cell. In contrast, in the case where data '0' has been written in ferroelectric transistor 110, since an electric field formed in ferroelectric transistor 110 is 0, current does not flow through out line $V_{OUT}$ or only a very small amount of current flows through out line $V_{OUT}$. Therefore, 0 or a voltage of a very small magnitude is measured on the out line $V_{OUT}$ side, thereby capable of determining the data '0' written in the memory cell.

As shown in the timing diagram of FIG. 14, after the read operation is performed on each row, the voltage on the out line $V_{OUT}$ side is reset to a low level. This is because in the case where the voltage on the out line $V_{OUT}$ side is not reset, the voltage on the out line $V_{OUT}$ side maintains information of the previous row, and thus, a malfunction may occur when a read operation on the next row is performed.

Figure 15C:
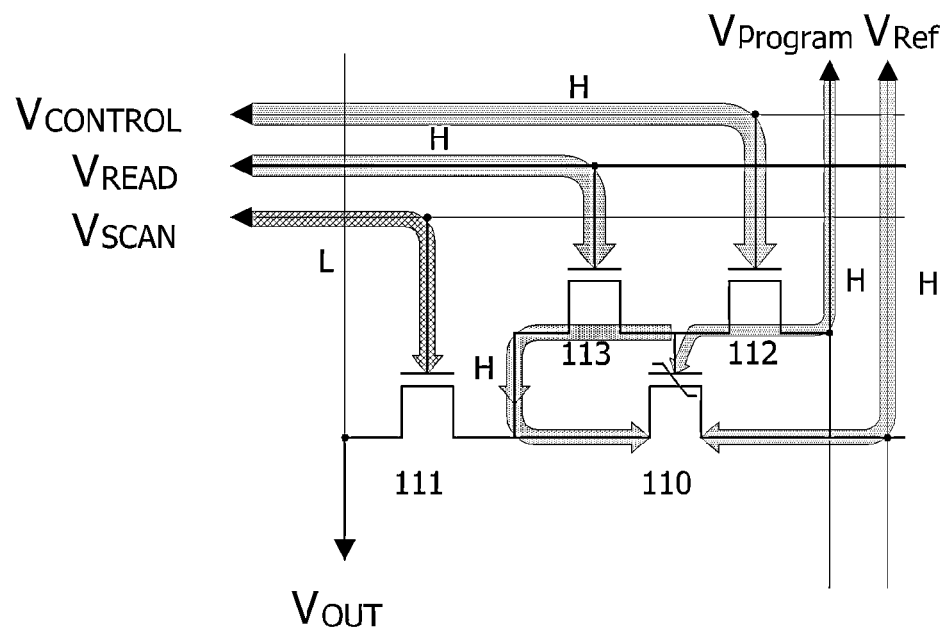

FIG. 15C shows a standby operation in which a data read operation on a memory cell according to the timing diagram of FIG. 14 is not performed. While a read operation is performed on any one row of the memory array, first, the same high voltage as the reference lines $V_{Ref}$ side is applied to program lines $V_{Program}$, a low signal L is applied to scan lines $V_{SCAN}$, a high signal H is applied to control lines $V_{Program}$, and a high signal H is applied to read lines $V_{READ}$ in a standby operation section of another row, as shown in FIG. 15C. First pass transistor 111 is turned off such that a corresponding cell is disconnected from out line $V_{OUT}$. Further, second pass transistor 112 and third pass transistor 113 are turned on such that all of voltages of a gate, a source, and a drain of the ferroelectric transistor maintain a high state so as not to influence the polarization state of the ferroelectric material. Therefore, during the data read operation, it is possible to safely maintain data in the standby operation section.

As described with reference to FIGS. 15A, 15B, and 15C, according to the exemplary embodiment of the present disclosure, since individual pass transistors 111, 112, and 113 are separately controlled to be turned on or off by control lines $V_{CONTROL}$, read lines $V_{READ}$, and scan lines $V_{SCAN}$, a floating electrode does not occur in ferroelectric transistor 110 in all sections of the data write operation and the standby operation.

Similar to the write operation, the read operation on the memory cells is performed for each row through the above-mentioned method to complete the read operation on all rows. Then, the read operation on the entire memory cell array is completed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A memory cell comprising:
   a ferroelectric transistor;
   a plurality of switching elements electrically connected to the ferroelectric transistor; and
   a plurality of control lines for transmitting individual control signals to each of the plurality of switching elements for separately controlling the plurality of switching elements,
   wherein the plurality of switching elements are configured to be separately controlled on the basis of the individual control signals so as to prevent each electrode of the ferroelectric transistor from being floated.

2. The memory cell of claim 1, wherein each of the plurality of switching elements is a pass transistor configured to be connected to at least one electrode of the ferroelectric transistor.

3. The memory cell of claim 2, wherein the plurality of switching elements include a first switching element, a second switching element, and a third switching element, and
   the first switching element is connected to a source electrode of the ferroelectric transistor, the second switching element is connected to a gate electrode of the ferroelectric transistor, and the third switching element is connected to both of the source electrode and the gate electrode of the ferroelectric transistor.

4. The memory cell of claim 3, wherein the plurality of control lines include a first control line, a second control line, and a third control line, and
   the first control line, the second control line, and the third control line are connected to the gate electrodes of the first switching element, the second switching element, and the third switching element, respectively, to turn on or off the first switching element, the second switching element, and the third switching element, respectively.

5. The memory cell of claim 4, further comprising:
   a first input/output line and a second input/output line,
   wherein the first switching element switches connection between the source electrode and the first input/output line, the second switching element switches connection between the gate electrode and the second input/output line, and the third switching element switches connection between the source electrode and the gate electrode.

6. The memory cell of claim 5, further comprising a third input/output line connected to a drain electrode of the ferroelectric transistor.

7. The memory cell of claim 6, wherein in a write operation on the memory cell,
   the first switching element and the second switching element are turned on by control of the first control line and the second control line, respectively, and the third switching element is turned off by control of the third control line.

8. The memory cell of claim 7, wherein in an operation for writing 1 in the memory cell,
   a low signal is applied to the first input/output line and the third input/output line, and a high signal is applied to the second input/output line.

9. The memory cell of claim 7, wherein in an operation for writing 0 in the memory cell,
   a high signal is applied to the first input/output line and the third input/output line, and a low signal is applied to the second input/output line.

10. The memory cell of claim 7, wherein in an operation for writing 0 in the memory cell,
    a signal of 0 V is applied to the first input/output line and the third input/output line, and a negative voltage of a predetermined magnitude is applied to the second input/output line.

11. The memory cell of claim 8, wherein when the memory cell is in a standby state in which a write operation is not performed,
    the first switching element and the third switching element are turned on by control of the first control line and the third control line, respectively, and the second switching element is turned off by control of the second control line.

12. The memory cell of claim 6, wherein in a read operation on the memory cell,
    the first switching element and the third switching element are turned on by control of the first control line and the third control line, respectively, the second switching element is turned off by control of the second control line, and a high signal is applied to the third input/output line.

13. The memory cell of claim 12, wherein information stored in the memory cell is read on the basis of measurement of current flowing in the first input/output line.

14. The memory cell of claim 13, wherein when the measured current of the first input/output line is greater than a predetermined reference value, the information stored in the memory cell is read as 1, and when the measured current of the first input/output line is smaller than the predetermined reference value, the information stored in the memory cell is read as 0.

15. The memory cell of claim 12, wherein a capacitive element is connected to the first input/output line, and information stored in the memory cell is read on the basis of measurement of a voltage applied to the capacitive element.

16. The memory cell of claim 15, wherein, the information stored in the memory cell is read as 1 when the measured voltage of the capacitive element is greater than a predetermined reference value, and the information stored in the memory cell is read as 0 when the measured voltage of the capacitive element is smaller than the predetermined reference value.

17. The memory cell of claim 12, wherein after the read operation of information stored in the memory cell is performed, the first input/output line is reset.

18. A memory device comprising:
    a plurality of memory cells arranged in a plurality of rows and a plurality of columns,
    wherein each of the plurality of memory cell includes a ferroelectric transistor, a plurality of switching elements electrically connected to the ferroelectric transistor, and a plurality of control lines for transmitting individual control signals to each of the plurality of switching elements for separately controlling the plurality of switching elements,
    wherein the plurality switching elements are configured to be separately controlled on the basis of the individual control signals so as to prevent each electrode of the ferroelectric transistor from being floated, and
    wherein a plurality of switching elements arranged in each row are controlled by a plurality of control lines corresponding to each row.

* * * * *